United States Patent
Yu et al.

(10) Patent No.: US 12,538,620 B2
(45) Date of Patent: Jan. 27, 2026

(54) LIGHT EMITTING SUBSTRATE, METHOD FOR MANUFACTURING THEREOF, AND DISPLAY APPARATUS

(71) Applicants: BOE MLED Technology Co., Ltd., Beijing (CN); BOE Technology Group Co., Ltd., Beijing (CN)

(72) Inventors: Honghao Yu, Beijing (CN); Yutao Hao, Beijing (CN); Donglei Li, Beijing (CN); Ying Chen, Beijing (CN); Jie Gao, Beijing (CN); Jiaxin Li, Beijing (CN); Pei Qin, Beijing (CN); Lili Jia, Beijing (CN)

(73) Assignees: BOE MLED Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/028,467

(22) PCT Filed: May 27, 2022

(86) PCT No.: PCT/CN2022/095707
§ 371 (c)(1),
(2) Date: Mar. 24, 2023

(87) PCT Pub. No.: WO2023/226019
PCT Pub. Date: Nov. 30, 2023

(65) Prior Publication Data
US 2025/0081692 A1     Mar. 6, 2025

(51) Int. Cl.
*H10H 20/856*     (2025.01)
*G02F 1/1335*     (2006.01)
(Continued)

(52) U.S. Cl.
CPC ......... *H10H 20/856* (2025.01); *H01L 25/167* (2013.01); *H10H 20/0363* (2025.01)

(58) Field of Classification Search
CPC ............ G02F 1/133603; H10H 20/856; H10H 20/0363; H10H 29/8421; H10H 29/856;
(Continued)

(56) References Cited

U.S. PATENT DOCUMENTS

2021/0135066 A1* 5/2021 Watanabe .......... H10H 20/8512
2022/0163849 A1* 5/2022 Tien .................. G02F 1/133603
(Continued)

FOREIGN PATENT DOCUMENTS

CN          203365860 U     12/2013
CN          214704248 U     11/2021
(Continued)

*Primary Examiner* — Antonio B Crite
(74) *Attorney, Agent, or Firm* — IPro, PLLC

(57) ABSTRACT

Provided are a light emitting substrate, a method for manufacturing same, and a display apparatus. The light emitting substrate includes a base substrate; a plurality of light emitting units located at a side of the base substrate; a plurality of protective structures located at a side of the plurality of light emitting units facing away from the base substrate; the plurality of protective structures each covers a respective one of the plurality of light emitting units; and a plurality of reflective patterns located at a side of the plurality of protective structures facing away from the plurality of light emitting units; orthographic projections of the plurality of reflective patterns on the base substrate fall within orthographic projections of the plurality of protective structures on the base substrate.

13 Claims, 7 Drawing Sheets

(51) Int. Cl.
  *G02F 1/13357* (2006.01)
  *H01L 25/16* (2023.01)
  *H10H 20/01* (2025.01)
  *H10H 29/01* (2025.01)
  *H10H 29/80* (2025.01)
  *H10H 29/853* (2025.01)
(58) Field of Classification Search
  CPC . H10H 29/0363; H10H 29/853; H01L 25/167
  See application file for complete search history.

(56) References Cited

U.S. PATENT DOCUMENTS

2023/0136566 A1* 5/2023 Wu .................. H01L 25/0753
  257/79
2023/0290763 A1* 9/2023 Meitl .................. H01L 25/167

FOREIGN PATENT DOCUMENTS

| CN | 214751236 U | | 11/2021 |
|----|-------------|---|---------|
| CN | 215416207 U | * | 1/2022 |
| CN | 115407551 A | | 11/2022 |

\* cited by examiner

LIGHT EMITTING SUBSTRATE, METHOD FOR MANUFACTURING THEREOF, AND DISPLAY APPARATUS

CROSS REFERENCE TO RELATED APPLICATIONS

The present disclosure is a national phase entry under 35 U.S.C § 371 of International Application No. PCT/CN2022/095707, filed May 27, 2022, and entitled "LIGHT EMITTING SUBSTRATE, METHOD FOR MANUFACTURING THEREOF, AND DISPLAY APPARATUS".

FIELD

The present disclosure relates to the technical field of display, and particularly to a light emitting substrate, a method for manufacturing same, and a display apparatus.

BACKGROUND

Mini light emitting diode (Mini-LED) display is a novel booming display technology in recent years. With an abundance of advantages, such as a small size, a controllable wavelength, high light emitting efficiency, long service life and a pollution-free light emitting material, a mini LED has been applied to a display.

SUMMARY

Embodiments of the present disclosure provide a light emitting substrate. The light emitting substrate includes:
a base substrate;
a plurality of light emitting units located at a side of the base substrate;
a plurality of protective structures located at a side of the plurality of light emitting units facing away from the base substrate; the plurality of protective structures each covers a respective one of the plurality of light emitting units; and
a plurality of reflective patterns located at side of the plurality of protective structures facing away from the plurality of light emitting units; orthographic projections of the plurality of reflective patterns on the base substrate fall within orthographic projections of the plurality of protective structures on the base substrate respectively.

In some embodiments, orthographic projections of the plurality of light emitting units on the base substrate fall within the orthographic projections of the plurality of reflective patterns on the base substrate respectively.

In some embodiments, a distance between a center of an orthographic projection of the protective structure on the base substrate and a center of an orthographic projection of the light emitting unit on the base substrate is less than a first preset value; and
a distance between a center of an orthographic projection of the reflective pattern on the base substrate and the center of the orthographic projection of the light emitting unit on the base substrate each is less than a second preset value.

In some embodiments, the quantity of the plurality of light emitting units is the same as the quantity of the plurality of protective structures, and the quantity of the plurality of protective structures is the same as the quantity of the plurality of reflective patterns.

In some embodiments, surfaces of sides of the plurality of protective structures facing away from the base substrate are first curved surfaces;
the plurality of reflective patterns are in direct contact with the surfaces of the plurality of protective structures;
surfaces of sides of the plurality of reflective patterns facing away from the plurality of protective structures are second curved surfaces; and
a shape of the second curved surface is the same as a shape of a partial region of the first curved surface.

In some embodiments, shapes of the orthographic projections of the plurality of protective structures on the base substrate are circles;
a contact surface between the reflective pattern and a corresponding protective structure intersects a plurality of planes perpendicular to the base substrate to form a plurality of arcs, and an arc length l of an arc having a maximum length in the plurality of arcs satisfies:

$$l = \frac{\pi(4h^2 + D^2)\arccos\left[\frac{(R-h)\tan^2\theta + \sqrt{(R-h)^2 - h(h-2R)(1+\tan^2\theta)}}{R(1+\tan^2\theta)}\right]}{1440h},$$

h is a maximum size of the protective structure in a direction perpendicular to the base substrate, D is a diameter of the orthographic projection of the protective structure on the base substrate, R is a radius of a spherical surface where the surface of the side of the protective structure facing away from the base substrate is located, and θ is a half-power angle of the light emitting unit.

In some embodiments, shapes of the orthographic projections of the plurality of reflective patterns on the base substrate are one type of shapes as follows: polygons, circles, ellipses and rings.

In some embodiments, material of the reflective pattern has reflectivity greater than 90%.

In some embodiments, a thickness of the reflective pattern is greater than or equal to 20 microns and less than or equal to 30 microns.

In some embodiments, a light emitting area of the light emitting unit is not greater than 50000 square microns.

The embodiments of the present disclosure provide a method for manufacturing a light emitting substrate. The method includes:
arranging a plurality of light emitting units at a side of a base substrate;
forming a plurality of protective structures at a side of the plurality of light emitting units facing away from the base substrate; the plurality of protective structures each covers a respective one of the plurality of light emitting units; and
forming a plurality of reflective patterns at a side of the plurality of protective structures facing away from the plurality of light emitting unit; orthographic projections of the plurality of reflective patterns on the base substrate fall within orthographic projections of the plurality of protective structures on the base substrate.

In some embodiments, the forming a plurality of reflective patterns at a side of the plurality of protective structures facing away from the plurality of light emitting units includes:

forming the plurality of reflective patterns at the side of the plurality of protective structures facing away from the plurality of light emitting units through a glue spraying process or a printing process.

In some embodiments, the forming plurality of reflective patterns at a side of the plurality of protective structures facing away from the plurality of light emitting units includes:

forming a reflective layer at the side of the plurality of protective structure facing away from the plurality of light emitting units; and carrying out an exposure process and a development process on the reflective layer to form a plurality of reflective patterns.

In some embodiments, the forming a plurality of protective structures covering the plurality of light emitting units at a side of the plurality of light emitting units facing away from the base substrate includes:

forming patterns of the plurality of protective structures at the side of the plurality of light emitting units facing away from the base substrate through a glue dispensing process or a jetting process.

The embodiments of the present disclosure provide a display apparatus. The display apparatus includes:

the light emitting substrate provided in the embodiments of the present disclosure; and a display panel located at a light emitting side of the light emitting substrate.

BRIEF DESCRIPTION OF THE DRAWINGS

In order to describe technical solutions in embodiments of the present disclosure more clearly, accompanying drawings required for describing embodiments are briefly introduced below. Apparently, accompanying drawings in the following description show merely some embodiments of the present disclosure, and those of ordinary skill in the art would also be able to derive other accompanying drawings from these accompanying drawings without creative efforts.

DETAILED DESCRIPTION OF THE EMBODIMENTS

Figure 1:
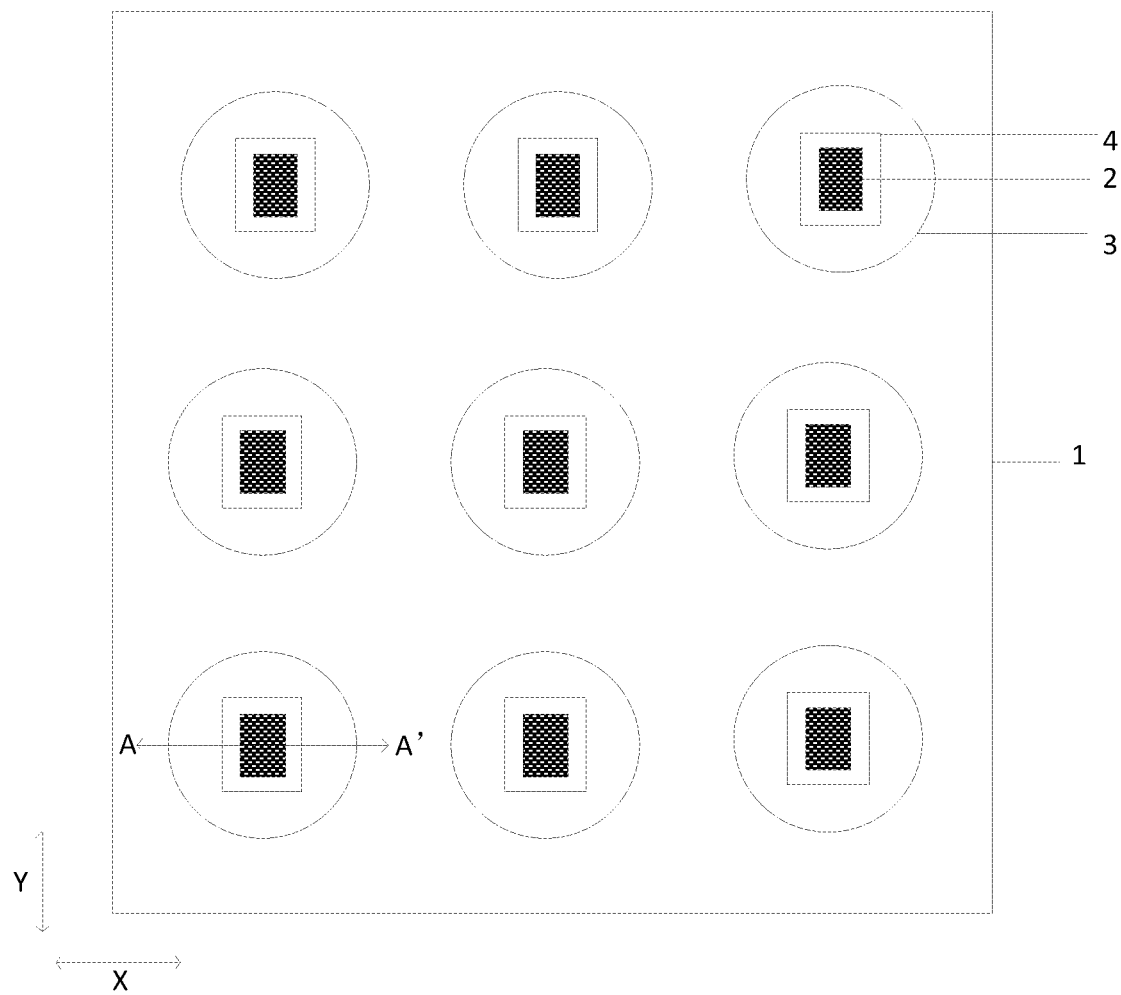
FIG. 1 is a schematic structural diagram of a light emitting substrate according to an embodiment of the present disclosure.

In order to make objectives, technical solutions and advantages of embodiments of the present disclosure clearer, the technical solutions of the present disclosure will be clearly and completely described below in combination with accompanying drawings in the embodiments of the present disclosure. Apparently, the described embodiments are merely some embodiments rather than all embodiments of the present disclosure. In addition, embodiments of the present disclosure and features in the embodiments can be combined with each other without conflict. On the basis of the described embodiments of the present disclosure, all other embodiments obtained by those of ordinary skill in the art without making creative efforts fall within the scope of protection of the present disclosure.

Unless otherwise defined, technical terms or scientific terms used in the present disclosure should have the ordinary meanings understood by those of ordinary skill in the art to which the present disclosure belongs. "First", "second" and other similar words used in the present disclosure do not indicate any order, quantity or importance, but are merely used to distinguish between different components. "Comprise", "include" or other similar words mean that an element or object appearing before the word contains elements or objects listed after the word and equivalents thereof, without excluding other elements or objects. "Connection", "connected with each other" or other similar words are not limited to physical or mechanical connections, but can include electrical connections, which are direct or indirect.

It should be noted that sizes and shapes of all figures in accompanying drawings do not reflect true scales and are merely intended to illustrate contents of the present disclosure. Moreover, the same or similar reference numerals denote the same or similar elements or elements having the same or similar functions throughout.

Figure 2:
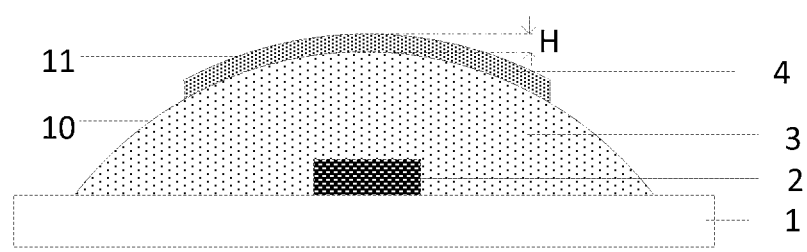
FIG. 2 is a sectional view along AA' in FIG. 1 according to an embodiment of the present disclosure.

Embodiment of the present disclosure provides a light emitting substrate. As shown in FIGS. 1 and 2, the light emitting substrate includes:

a base substrate 1;

a plurality of light emitting units 2 located at a side of the base substrate 1;

a plurality of protective structures 3 located at a side of the plurality of light emitting units 2 facing away from the base substrate 1; the plurality of protective structures 3 each covers a respective one of the plurality of light emitting units 2; and a plurality of reflective patterns 4 located at a side of plurality of the protective structures 3 facing away from the plurality of light emitting units 2; orthographic projections of the plurality of reflective patterns 4 on the base substrate 1 fall within orthographic projections of the plurality of protective structures 3 on the base substrate 1.

According to the light emitting substrate provided in the embodiments of the present disclosure, the reflective patterns are arranged at a side of the protective structures facing away from the light emitting units, such that light emitted by the light emitting unit reaches interfaces between the reflective patterns and the protective structures to be reflected, and the light emitted by the light emitting units is emitted from regions of the protective structures not covered with the reflective patterns, thereby avoiding an overhigh optical distance caused by overlarge intensity of the light emitted from tops of the light emitting units. That is, compared with a case in which no reflective pattern is arranged, emitted light patterns of the light emitting units may be changed to reduce an optical distance, thereby thinning the light emitting substrate. Moreover, cost may be saved while the optical distance is reduced without increasing the quantity of light emitting units.

It should be noted that in a case in which the light emitting substrate is used as a light source of a passive display product, an optical film including optical film materials such as a diffusion film and a polarizer is generally arranged on a light emitting side of the light emitting substrate, and the optical distance is a distance between two opposite surfaces of the base substrate and the optical module in a direction perpendicular to the base substrate.

It should be noted that FIG. 2 is a sectional view along AA' in FIG. 1. In FIG. 1, a plurality of light emitting units 2 are arranged in an array in a first direction X and a second direction Y, and the first direction X is perpendicular to the second direction Y.

In some embodiments, the quantity of the plurality of light emitting units is the same as the quantity of the plurality of protective structures, and the quantity of the plurality of protective structures is the same as the quantity of plurality of the reflective patterns.

Therefore, each light emitting unit is covered with a protective structure, and a reflective pattern is arranged at a side of each protective structure facing away from the corresponding light emitting unit, such that an emitted light pattern of each light emitting unit is modulated, for example, a light emitting angle of each light emitting unit is increased.

In some embodiments, as shown in FIG. 1, orthographic projections of the plurality of light emitting units 2 on the base substrate 1 fall within the orthographic projections of the plurality of reflective patterns 4 on the base substrate 1 respectively.

According to the light emitting substrate provided in the embodiments of the present disclosure, the orthographic projections of the plurality of light emitting units on the base substrate fall into the orthographic projections of the plurality of reflective patterns on the base substrate respectively, that is, an area of the light emitting unit is less than an area of the corresponding reflective pattern, and the corresponding reflective pattern covers a region of the light emitting unit, such that light emitted by the light emitting units may be reflected by the reflective patterns as much as possible, and emitted from regions of the protective structures not covered with the reflective patterns, so as to reduce an optical distance.

In some embodiments, a distance between a center of an orthographic projection of the protective structure on the base substrate and a center of an orthographic projection of a corresponding light emitting unit on the base substrate is less than a first preset value; and a distance between a center of an orthographic projection of the reflective pattern on the base substrate and the center of the orthographic projection of the corresponding light emitting unit on the base substrate is less than a second preset value.

During specific implementation, the first preset value is a maximum value of the distance between the center of the orthographic projection of the protective structure on the base substrate and the center of the orthographic projection of the corresponding light emitting unit on the base substrate under the condition of allowable process errors. The second preset value is a maximum value of the distance between the center of the orthographic projection of the reflective pattern on the base substrate and the center of the orthographic projection of the corresponding light emitting unit on the base substrate under the condition of allowable process errors. That is, according to the light emitting substrate provided in the embodiment of the present disclosure, the center of the orthographic projection of the reflective pattern on the base substrate, the center of the orthographic projection of the corresponding protective structures on the base substrate, and the center of the orthographic projection of the corresponding light emitting unit on the base substrate substantially overlap within an allowable error range.

In some embodiments, the first preset value is equal to the second preset value. During specific implementation, in a case in which the first preset value is equal to the second preset value, a ratio of the first preset value to a length or a width of the light emitting unit is less than or equal to 1:5. For example, in a case in which the light emitting unit has a length or width less than or equal to 500 microns, the first preset value and the second preset value each are less than or equal to 100 microns.

In some embodiments, as shown in FIG. 2, surfaces of sides of the plurality of protective structures 3 facing away from the base substrate 1 are first curved surfaces 10;

the plurality of reflective patterns 4 are in direct contact with the surfaces of the plurality of protective structures 3;

surfaces of sides of the plurality of reflective patterns 4 facing away from the plurality of protective structures 3 are second curved surfaces 11; and a shape of the second curved surface 11 is the same as a shape of a partial region of the first curved surface 10.

In some embodiments, as shown in FIG. 2, distances between the second curved surfaces 11 and the first curved surfaces 10 are the same at any position in the direction perpendicular to the base substrate 1. The first curved surfaces 10 and second curved surfaces 11 each may be part of a spherical surface, and each first curved surface 10 and each second curved surface 11 correspond to two concentric spherical surfaces having different radii respectively.

That is, in the light emitting substrate provided in the embodiments of the present disclosure, the protective structures have convex lens shapes, and the protective structures having convex lens shapes have recesses corresponding to the light emitting units, that is, an entire structure composed of a protective structure and a corresponding light emitting unit is a structure in a complete convex lens shape. The protective structure having convex lens shape not only cover the corresponding light emitting unit to protect the corresponding light emitting unit, but also may change light emitting angle of the corresponding light emitting unit, such that the situation that the optical distance is increased due to overhigh light intensity caused by light concentration.

In some embodiments, the plurality of protective structures are made of transparent silicone.

In some embodiments, as shown in FIG. 2, a thickness H of the reflective pattern 4 is greater than or equal to 20 microns and less than or equal to 30 microns.

In some embodiments, a light emitting area of the light emitting unit is not greater than 50000 square microns.

In some embodiments, as shown in FIG. 1, shapes of the orthographic projections of the protective structures 3 on the base substrate 1 are circles. A ratio of a maximum size of each protective structure in a direction perpendicular to the base substrate to a diameter of an orthographic projection of the protective structure on the base substrate is greater than or equal to 1:3 and less than or equal to 1:5. For example, a maximum size of each protective structure in the direction perpendicular to the base substrate is 500 microns, and the diameter of the orthographic projection of the protective structure on the base substrate is not greater than 2500 microns.

In some embodiments, as shown in FIG. 1, shapes of the orthographic projections of the reflective patterns 4 on the base substrate 1 are rectangles.

Figure 4A:
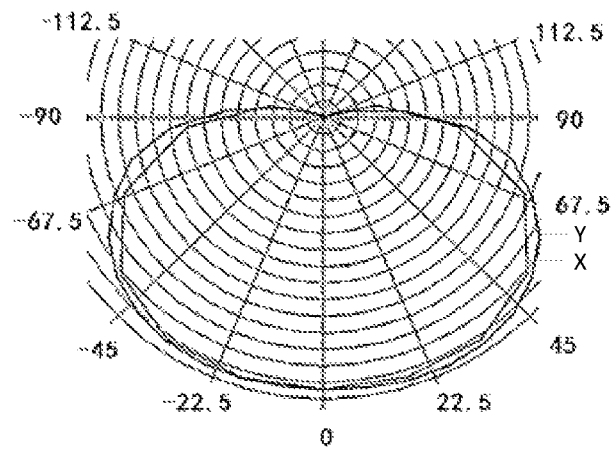
FIGS. 4A and 4B are schematic diagrams of emitted light patterns corresponding to light emitting units according to embodiments of the present disclosure.
Figure 4B:
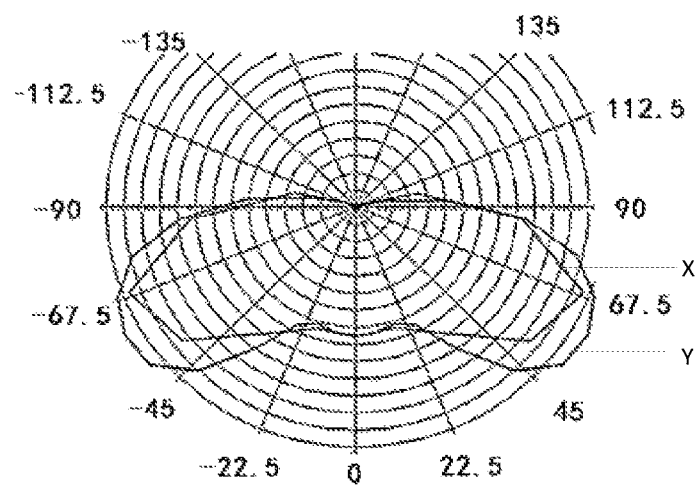

FIG. 4A illustrates an emitted light pattern in a case in which protective structures are arranged at the light emitting sides of the light emitting units, where the protective structures each has a convex lens shape, and the shapes of the orthographic projections of the protective structures on the base substrate are circles. FIG. 4B illustrates an emitted light pattern in a case in which protective structures having reflective patterns on surfaces are arranged on the light emitting sides of the light emitting units, where the protective structures each has a convex lens shape, and the shapes of the orthographic projections of the protective structures on the base substrate are circles, and the shapes of the orthographic projections of the reflective patterns on the base substrate are rectangles. It can be seen that compared with FIG. 4A, FIG. 4B shows a change in the emitted light patterns of the entire structure, that is, by arranging the reflective patterns on the protective structures, the light emitting angles of the light emitting units may be effectively increased. FIGS. 4A and 4B each include two curves, one of the two curves is an emitted light pattern curve of a corresponding structure in a first direction X, and the other one of the two curves is an emitted light pattern curve of a corresponding structure in a second direction Y.

Figure 3:
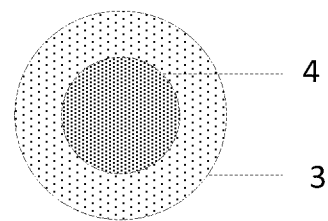
FIG. 3 is a schematic structural diagram of another light emitting substrate according to an embodiment of the present disclosure.

Alternatively, as shown in FIG. 3, the shapes of the orthographic projections of the reflective patterns 4 on the base substrate 1 are circles.

Certainly, during specific implementation, the shapes of the orthographic projections of the reflective patterns on the base substrate may be polygons, ellipses, rings or other shapes. That is, the shapes of the orthographic projections of the reflective patterns on the base substrate are one type of shapes as follows: polygons, circles, ellipses and rings. During specific implementation, the polygons are, for example, triangles, quadrangles, pentagons or hexagons.

Next, analysis results of optical pictures of light emitting substrates each including a plurality of light emitting units will be introduced.

Optical pictures of a first type of light emitting substrate, a second type of light emitting substrate and a third type of light emitting substrate are shown in FIGS. 5A-5I. The first type of light emitting substrate, the second type of light emitting substrate and the third type of light emitting substrate each include nine light emitting units and protective structures arranged on all the light emitting units, and arrangement rules of the nine light emitting units and the nine protective structures of each of the first type of light emitting substrate, the second type of light emitting substrate and the third type of light emitting substrate are the same. As shown in FIG. 6, the nine light emitting units 2 are arranged in a matrix of three rows and three columns, an area of an orthographic projection of each light emitting unit 2 on the base substrate are the same, a shape of the orthographic projection of the each light emitting unit 2 on the base substrate 1 is square, a side length a of the square is 0.35 mm, and a distance b between centers of the orthographic projections of two adjacent light emitting units 2 on the base substrate 1 in a first direction X is 6 mm, and a distance c between centers of the orthographic projections of two adjacent light emitting units 2 on the base substrate 1 in a second direction Y is 6 mm. Each light emitting unit 2 is covered with a protective structure 3, areas of the orthographic projections of all the protective structures 3 on the base substrate are the same, and a diameter D of the orthographic projection of each protective structure 3 on the base substrate 1 is 2.5 mm.

Figure 5A:
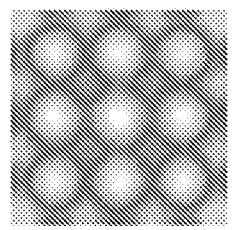
FIGS. 5A-5I are schematic diagrams of optical pictures of light emitting substrates according to embodiments of the present disclosure.
Figure 5B:
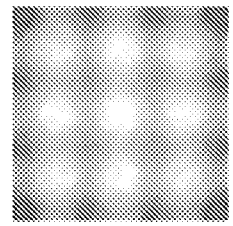
Figure 5C:
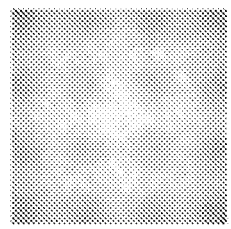
Figure 5D:
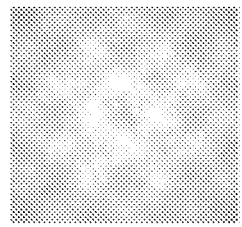
Figure 5E:
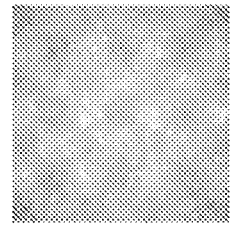
Figure 5F:
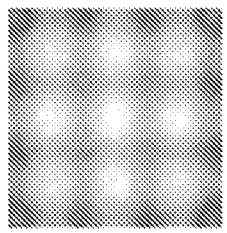
Figure 5G:
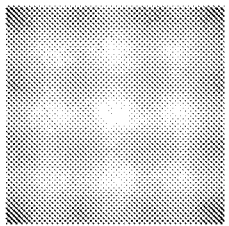
Figure 5H:
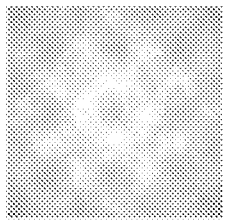
Figure 5I:
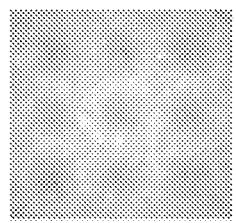
Figure 6:
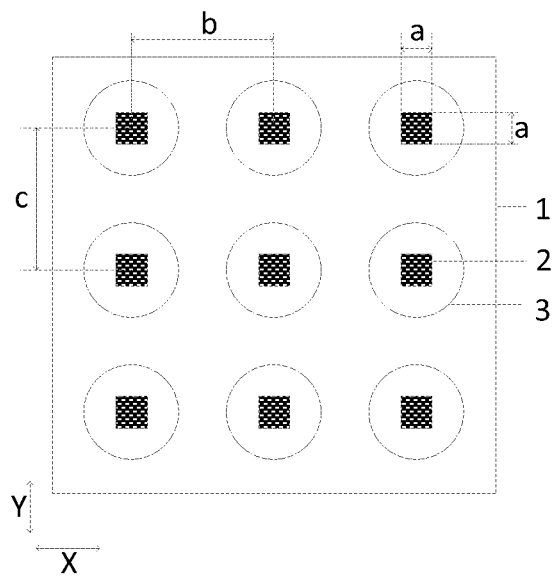
FIG. 6 is a schematic diagram of arrangement rules of light emitting units and protective structures of a first type of light emitting substrate, a second type of light emitting substrate and a third type of light emitting substrate according to embodiments of the present disclosure.

The first type of light emitting substrate does not include reflective patterns, that is, the light emitting units are only covered with the protective structures, and the optical picture of the first type of light emitting substrate is as shown in FIG. 5A. The second type of light emitting substrate further includes nine reflective patterns, the reflective patterns are located at sides of the protective structures facing away from the light emitting units, shapes of the orthographic projections of the reflective patterns on the base substrate are squares, and the optical pictures of the second type of light emitting substrate are as shown in FIGS. 5B-5E. Side lengths of the orthographic projections of the reflective patterns corresponding to FIGS. 5B-5E on the base substrate are different, and the side lengths of the orthographic projections of the reflective patterns corresponding to FIGS. 5B-5E on the base substrate are 0.5 mm, 1 mm, 1.5 mm and 2 mm respectively. The third type of light emitting substrate further includes nine reflective patterns, the reflective patterns are located at sides of the protective structures facing away from the light emitting units, the shapes of the orthographic projections of the reflective patterns on the base substrate are circles, and the optical picture of the third type of light emitting substrate is as shown in FIGS. 5F-5I. Diameters of the orthographic projections of the reflective patterns corresponding to FIGS. 5F-5I on the base substrate are different, and the diameters of the orthographic projections of the reflective patterns corresponding to FIGS. 5F-5I on the base substrate are 0.5 mm, 1 mm, 1.5 mm and 2 mm respectively.

In a case in which the light emitting units are only covered with the protective structures and no reflective patterns are arranged at the sides of the protective structures facing away from the light emitting units, from the optical picture shown in FIG. 5A, it can be seen that the entire structure composed of a light emitting unit and a corresponding protective structure constitutes a light emitting region, boundaries between adjacent light emitting regions are extremely obvious, and approximately ring-shaped dark shadow regions in FIG. 5A are boundaries of the corresponding light emitting regions, that is, all the light emitting regions may be clearly distinguished from the optical picture shown in FIG. 5A, that is, an optical mixing effect is poor, resulting in uneven brightness across the light emitting substrate.

In a case in which reflective patterns of which shapes of orthographic projections on the base substrate are rectangles are arranged at the sides of the protective structures covering the light emitting units facing away from the light emitting units, according to the optical pictures shown in FIGS. 5B-5E, it can be seen that the dark shadow regions are significantly reduced, that is, boundaries of all the light emitting regions of the entire structures composed of the light emitting units, the protective structures and the reflective patterns are not obvious, there is an overlapping area between any two adjacent light emitting regions, and as sizes of the orthographic projections of the reflective patterns on the base substrate gradually increase, overlapping areas of the light emitting regions between adjacent entire structures are larger, the optical mixing effect is better, brightness of all portions of the light emitting substrate is more uniform. In the optical pictures of FIGS. 5B-5E, boundaries of the light emitting regions are increasingly non-obvious, for example, in the optical picture of FIG. 5E, the boundaries of all the light emitting regions are almost indistinguishable, and brightness of all the regions of the light emitting substrate is relatively uniform.

In a case in which reflective patterns of which shapes of orthographic projections on the base substrate are circles are arranged at the side of the protective structures covering the light emitting units facing away from the light emitting units, according to the optical pictures shown in FIGS. 5F-5I, it can be seen that the dark shadow regions are significantly reduced, that is, boundaries of the light emitting regions of the entire structures composed of the light emitting units, the protective structures and the reflective patterns are non-obvious, the light emitting regions of adjacent entire structures overlap, and as side lengths of the orthographic projections of the reflective patterns on the base substrate gradually increase, overlapping areas of the light emitting regions between the adjacent entire structures are larger, the optical mixing effect between different entire structures is better, and brightness of all the portions of the light emitting substrate is more uniform. In the optical pictures of FIGS. 5F-5I, the boundaries of all the light emitting regions are increasingly non-obvious, for example, in the optical picture of FIG. 5I, the boundaries of the light emitting regions are almost indistinguishable, and brightness of all the regions of the light emitting substrate is relatively uniform. According to FIGS. 5A and 5B-5I, it can be seen that compared with the optical picture in which only the light emitting units and the protective structures covering the light emitting units are arranged but no reflective patterns are arranged, by arranging the light emitting units, the protective structures and the reflective patterns, the optical mixing effects may be significantly improved and the optical distances may be reduced. According to FIGS. 5B-5E and 5F-5I, it can be seen that in a case in which the shapes of the orthographic projections of the reflective patterns on the base substrate are squares or circles, the optical mixing effects may be improved, the sizes of the reflective patterns are larger, and the optical mixing effects are better.

Figure 7:
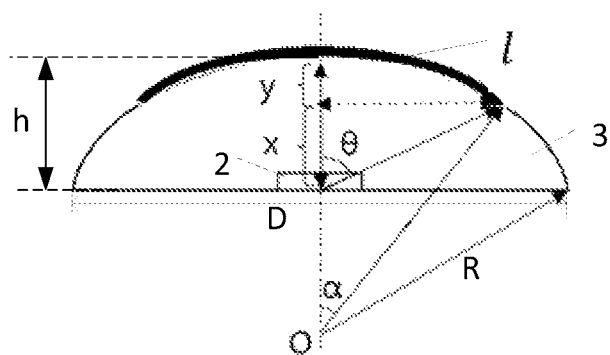
FIG. 7 is a schematic diagram of a size relation between a reflective pattern and a protective structure according to an embodiment of the present disclosure.

In some embodiments, a contact surface between each reflective pattern and the corresponding protective structure intersects a plurality of planes perpendicular to the base substrate, so as to obtain a plurality of arcs. As shown in FIG. 7, the arc having a maximum length of the plurality of arcs has an arc length of l, and in FIG. 7, O is a center of a circle corresponding to the arc having the arc length of l, h is a maximum size of the protective structure in the direction perpendicular to the base substrate, D is a diameter of the orthographic projection of the protective structure on the base substrate, R is a radius of a spherical surface on which a surface of the protective structure on the side facing away from the base substrate is located (that is, a radius of a circle corresponding to the arc having the arc length of l), and $\theta$ is a half-power angle of the light emitting unit. During specific implementation, in order to enable the reflective patterns to reflect the light emitted from the light emitting units, the reflective patterns at least cover light emitting angles of the light emitting units, that is, the arc having a maximum length of the plurality of arcs has an arc length of l and has an angle of $2\theta$ relative to the center of the orthographic projection of the light emitting unit on the base substrate, where $\theta$ is the half-power angle of the light emitting unit, intensity of light emitted by the light emitting unit in a direction having an included angle $\theta$ with a normal direction is half of intensity of light emitted by the light emitting unit in a normal direction of a light emitting surface, and a power angle of the light emitting unit is twice the half-power angle.

According to a geometric relation in FIG. 7, it can be seen that $$R^2 = (R-h)^2 + \left(\frac{D}{2}\right)^2;$$

$$h = x + y;$$

$$R^2 = (R-h+x)^2 + (x\tan\theta)^2; \text{ and then}$$

$$x = \frac{h - R + \sqrt{(R-h)^2 - h(h-2R)(1+\tan^2\theta)}}{1+\tan^2\theta}.$$

According to a geometric relation in FIG. 7, it also can be seen that $$\cos\alpha = \frac{x-h}{R} + 1 = \frac{-R - h\tan^2\theta + \sqrt{(R-h)^2 - h(h-2R)(1+\tan^2\theta)}}{R(1+\tan^2\theta)} + 1 =$$

$$\frac{(R-h)\tan^2\theta + \sqrt{(R-h)^2 - h(h-2R)(1+\tan^2\theta)}}{R(1+\tan^2\theta)}; \text{ and then}$$

$$\alpha = \arccos\frac{(R-h)\tan^2\theta + \sqrt{(R-h)^2 - h(h-2R)(1+\tan^2\theta)}}{R(1+\tan^2\theta)}$$

According to a geometric relation in FIG. 7, it also can be seen that $$\frac{l}{2a} = \frac{\pi R}{180}; \text{ and then}$$

$$l = \frac{2\alpha\pi R}{180} = \frac{\pi(4h^2 + D^2)arcos\left[\frac{(R-h)\tan^2\theta + \sqrt{(R-h)^2 - h(h-2R)(1+\tan^2\theta)}}{R(1+\tan^2\theta)}\right]}{1440h}.$$

That is, in the case of $$l = \frac{\pi(4h^2 + D^2)arcos\left[\frac{(R-h)\tan^2\theta + \sqrt{(R-h)^2 - h(h-2R)(1+\tan^2\theta)}}{R(1+\tan^2\theta)}\right]}{1440h},$$

the reflective patterns may completely reflect light emitted from the light emitting units.

Figure 8:
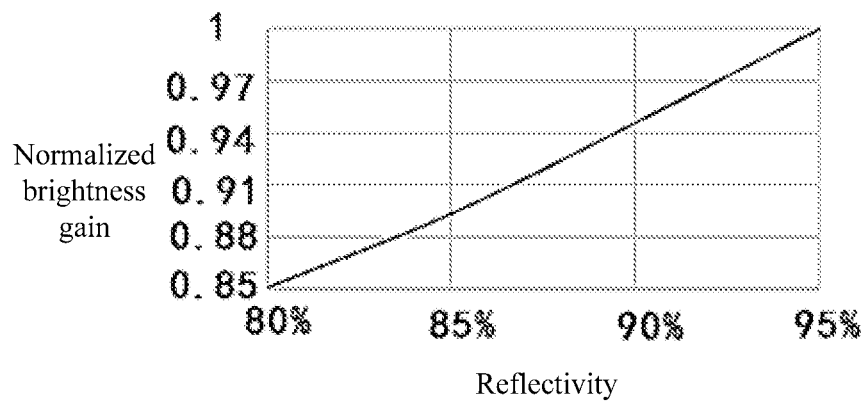
FIG. 8 is a schematic diagram of a relation between reflectivity and a brightness gain of a reflective pattern according to an embodiment of the present disclosure.

In some embodiments, material of each reflective pattern has reflectivity greater than 90%. A relation between reflectivity and a brightness gain of the reflective pattern is shown in FIG. 8, and it can be seen that the higher the reflectivity of the reflective pattern, the higher the normalized brightness gain, and the higher the brightness of the corresponding light emitting unit. During specific implementation, the reflective patterns may be made a material having high reflectivity, for example, white ink.

In some embodiments, a line layer is arranged on the base substrate for providing signals for the light emitting units.

During specific implementation, the line layer may further include a driving circuit, and the driving circuit may be a micro integrated circuit (IC), or a pixel circuit formed by a combination of a plurality of thin film transistors (TFTs).

In some embodiments, the base substrate is, for example, a printed circuit board (PCB) or a glass base substrate.

In some embodiments, each light emitting unit includes at least one light emitting device.

During specific implementation, each light emitting unit may include only one light emitting device, that is, the light emitting unit is a single-color light source, for example, the light emitting unit may only include one blue light emitting device.

Alternatively, during specific implementation, the light emitting unit may be a light source emitting white light, the light emitting unit includes a plurality of sub-pixels, each sub-pixel includes a light emitting device, and the plurality of sub-pixels include, for example, red sub-pixels, blue sub-pixels and green sub-pixels, lighting colors of the light emitting devices of all the sub-pixels are the same, and then color conversion is carried out by a quantum dot color film to emit light corresponding to lighting colors of the sub-pixels. For example, the light emitting devices emit blue light, the red sub-pixels include red light quantum dot color films for absorbing blue light and emitting red light, the green sub-pixels include green light quantum dot color films for absorbing blue light and emitting green light, and the blue sub-pixels may be provided with no quantum dot color films.

In some embodiments, that light emitting device is a micro-size inorganic light emitting diode. The micro-size inorganic light emitting diode may be, for example, a mini light emitting diode (Mini-LED) or a micro light emitting diode (Micro-LED).

It should be noted that the Mini-LED and the Micro-LED are small in size and high in brightness, and may be widely applied to display apparatuses or backlight modules thereof. For example, a typical size (for example, a length) of the Micro-LED is less than 100 microns, and a typical size (for example, a length) of the Mini-LED is 80 microns-350 microns.

During specific implementation, in a case in which the light emitting device is a micro-size inorganic light emitting diode, the light emitting device includes, for example, a p-type gallium nitride layer, a multi-quantum well layer and an n-type gallium nitride lay that are stacked.

Figure 9:
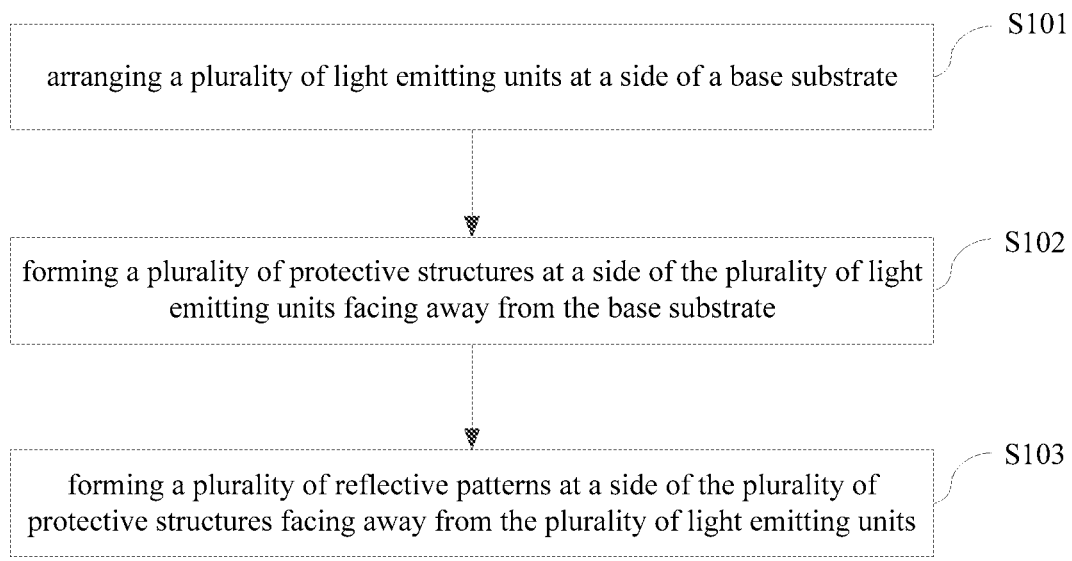
FIG. 9 is a schematic flow diagram of a method for manufacturing a light emitting substrate according to an embodiment of the present disclosure.

On the basis of the same inventive concept, the embodiments of the present disclosure further provide a method for manufacturing a light emitting substrate. As shown in FIG. 9, the method includes:

S101: arranging a plurality of light emitting units at a side of a base substrate;

S102: forming a plurality of protective structures at a side of the plurality of light emitting units facing away from the base substrate; the plurality of protective structures each covers a respective one of the plurality of light emitting units; and S103: forming a plurality of reflective patterns at a side of the plurality of protective structures facing away from the plurality of light emitting units; orthographic projections of the plurality of reflective patterns on the base substrate fall within orthographic projections of the plurality of protective structures on the base substrate respectively.

According to the method for manufacturing a light emitting substrate provided in the embodiments of the present disclosure, the reflective patterns are formed at the side of the protective structures facing away from the light emitting units, such that light emitted by the light emitting units reaches interfaces between the reflective patterns and the protective structure to be reflected, and the light emitted by the light emitting units is emitted from regions of the protective structures not covered with the reflective patterns. Compared with a case in which no reflective patterns are arranged, emitted light patterns of the light emitting units may be changed to reduce an optical distance such that the light emitting substrate having a thinner thickness may satisfy the optical mixing requirement, thereby thinning the light emitting substrate. Moreover, cost may be saved while the optical distance is reduced by forming the reflective structures rather than increasing the quantity of light emitting units.

In some embodiments, the step of arranging a plurality of light emitting units on a side of a base substrate includes: bond the plurality of light emitting units to the base substrate through a die bonding process.

During specific implementation, before the step of arranging a plurality of light emitting units on a side of a base substrate, the method further includes the step of manufacturing light emitting units, and then for example, the manufactured light emitting units are transferred on the base substrate through a mass transfer process, and are bound to the base substrate through a die bonding process, such that the light emitting units are electrically connected with a driving circuit arranged on the base substrate.

In some embodiments, the S102 of forming a plurality of protective structures covering the plurality of light emitting units at a side of the plurality of light emitting units facing away from the base substrate includes:

forming patterns of the plurality of protective structures at the side of the plurality of light emitting units facing away from the base substrate through a glue dispensing process or a jetting process.

During specific implementation, for example, the patterns of the plurality of protective structures with lens shapes are formed at the side of the plurality of light emitting units facing away from the base substrate through a glue dispensing process or a jetting process.

In some embodiments, the S103 of forming a plurality of reflective patterns at a side of the plurality of protective structures facing away from the plurality of light emitting units includes:

forming the plurality of reflective patterns at the side of the plurality of protective structures facing away from the plurality of light emitting units through a glue spraying process or a printing process.

Figure 10:
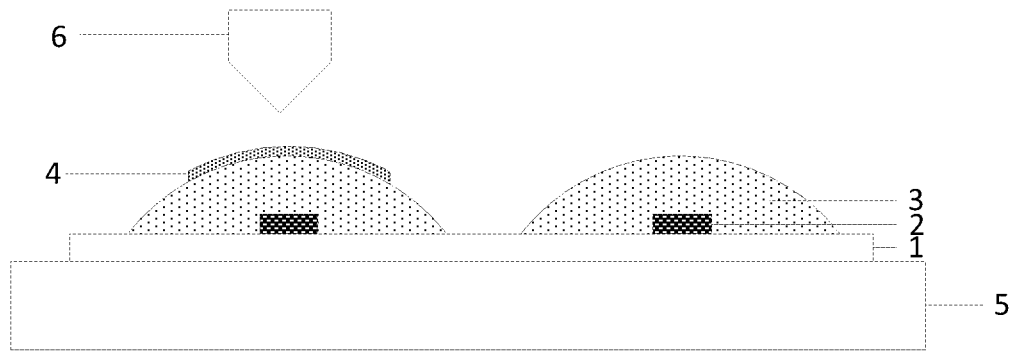
FIG. 10 is a schematic flow diagram of a method for manufacturing another light emitting substrate according to an embodiment of the present disclosure.

During specific implementation, as shown in FIG. 10, the base substrate 1 is placed on a platform 5, and the reflective patterns are formed by a component 6 containing a reflective material. In a case in which the reflective patterns are formed through the glue spraying process, the component 6 is a glue valve of a glue spraying device. In a case in which the reflective pattern is formed through the printing process, the component 6 is a nozzle of a printing device.

Figure 11:
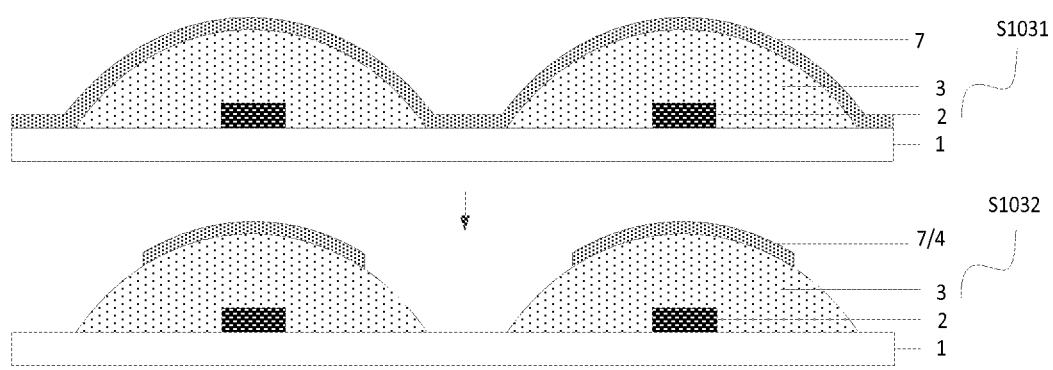
FIG. 11 is a schematic flow diagram of a method for manufacturing yet another light emitting substrate according to an embodiment of the present disclosure.

Alternatively, in some embodiments, as shown in FIG. 11, the step S103 of forming a plurality of reflective patterns at a side of the plurality of protective structures facing away from the plurality of light emitting units includes:

S1031: forming a reflective layer 7 at the side of the plurality of protective structures 3 facing away from the plurality of light emitting units 2; and S1032: performing an exposure process and a development process on the reflective layer 7 to form a plurality of reflective patterns 4.

According to the method for manufacturing a light emitting substrate provided in the embodiments of the present disclosure, in a case in which the plurality of reflective patterns are formed through the exposure process and the development process, manufacturing precision of the reflective patterns may be improved, and in the case of large quantity of reflective patterns, manufacturing efficiency may be increased.

During specific implementation, a suitable method for manufacturing a reflective pattern may be selected according to specific shapes and the quantity of the reflective patterns.

Figure 12:
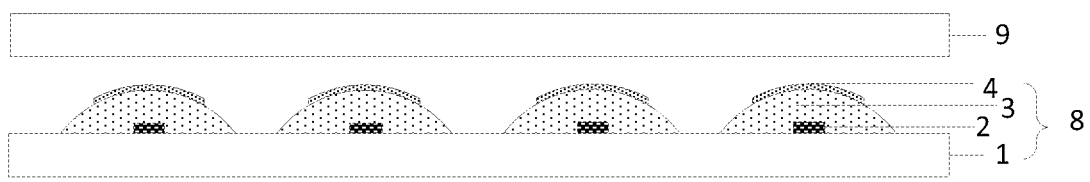
FIG. 12 is a schematic structural diagram of a display apparatus according to an embodiment of the present disclosure.

The embodiment of the present disclosure provides a display apparatus. As shown in FIG. 12, the display apparatus includes:

the light emitting substrate 8 provided in the embodiments of the present disclosure; and a display panel 9 located at a light emitting side of the light emitting substrate 8.

In some embodiments, the display panel is a liquid crystal display panel. The light emitting substrate serves as a backlight source of the liquid crystal display panel.

During specific implementation, the liquid crystal display panel includes: an array substrate and an opposite substrate that are oppositely arranged, and a liquid crystal layer located between the array substrate and the opposite substrate. The liquid crystal display panel includes a plurality of pixels arranged in an array, and each pixel includes a plurality of sub-pixels, for example, red sub-pixels, blue sub-pixels and green sub-pixels.

In some embodiments, a ratio of the quantity of display pixels in the liquid crystal display panel to the quantity of the light emitting units in the light emitting substrate is n, and n is a positive integer.

During specific implementation, the quantity of the display pixels in the liquid crystal display panel is greater than the quantity of the light emitting units in the light emitting substrate, that is, n is an integer greater than 1, for example, n is 10, that is, the quantity of the display pixels in the liquid crystal display panel is ten times the quantity of the light emitting units in the light emitting substrate.

In some embodiments, the display apparatus further includes an optical module located between the light emitting substrate and the display panel. The optical module includes optical films such as a light guide plate and a polarizer.

The display apparatus provided in the embodiments of the present disclosure may be a mobile phone, a tablet computer, a television, a monitor, a notebook computer, a digital photo frame, a navigator or any other products or components with display functions. Other essential components of the display apparatus would be understood by those of ordinary skill in the art and will not be repeated herein, and should not be regarded as a limitation to the present disclosure. For implementation of the display apparatus, reference may be made to the above embodiments of the light emitting substrate, and repetitions will not be described.

To sum up, according to the light emitting substrate, the method for manufacturing same, and the display apparatus provided in embodiments of the present disclosure, the reflective patterns are arranged on the side of the protective structures facing away from the light emitting units, such that light emitted by the light emitting units reaches interfaces between the reflective patterns and the protective structures to be reflected, and the light emitted by the light emitting units is emitted from regions of the protective structures not covered with the reflective patterns. Compared with a case in which no reflective patterns are arranged, emitted light patterns of the light emitting units may be changed to reduce an optical distance, such that the light emitting substrate having a thinner thickness may satisfy the optical mixing requirement, thereby thinning the light emitting substrate. Moreover, cost may be saved while the optical distance is reduced by forming the reflective structures rather than increasing the quantity of light emitting units.

Although the preferred embodiments of the present disclosure have been described, those skilled in the art can make additional changes and modifications to these embodiments once they learn the basic inventive concept. Therefore, the appended claims are intended to be interpreted as including the preferred embodiments and all changes and modifications falling within the scope of the present disclosure.

Apparently, those skilled in the art can make various modifications and variations to embodiments of the present disclosure without departing from the spirit and scope of the embodiments of the present disclosure. In this way, if these modifications and variations of the embodiments of the present disclosure fall within the scope of the claims of the present disclosure and equivalent technologies thereof, the present disclosure is also intended to include these modifications and variations.

What is claimed is:

1. A light emitting substrate, comprising:
a base substrate;
a plurality of light emitting units located at a side of the base substrate;
a plurality of protective structures located at a side of the plurality of light emitting units facing away from the base substrate, wherein the plurality of protective structures each covers a respective one of the plurality of light emitting units; and
a plurality of reflective patterns located at a side of the plurality of protective structures facing away from the plurality of light emitting units, wherein orthographic projections of the plurality of reflective patterns on the base substrate fall within orthographic projections of the plurality of protective structures on the base substrate respectively;
wherein surfaces of sides of the plurality of protective structures facing away from the base substrate are first curved surfaces;
the plurality of reflective patterns are in direct contact with the surfaces of the plurality of protective structures;
surfaces of sides of the plurality of reflective patterns facing away from the plurality of protective structures are second curved surfaces; and
a shape of the second curved surface is the same as a shape of a partial region of the first curved surface;
wherein shapes of the orthographic projections of the plurality of protective structures on the base substrate are circles; and
a contact surface between the reflective pattern and a corresponding protective structure intersects a plurality of planes perpendicular to the base substrate to form a plurality of arcs, and an arc length l of an arc having a maximum length in the plurality of arcs satisfies:

$$l = \frac{\pi(4h^2 + D^2)\arccos\left[\frac{(R-h)\tan^2\theta + \sqrt{(R-h)^2 - h(h-2R)(1+\tan^2\theta)}}{R(1+\tan^2\theta)}\right]}{1440h},$$

wherein h is a maximum size of the protective structure in a direction perpendicular to the base substrate, D is a diameter of the orthographic projection of the protective structure on the base substrate, R is a radius of a spherical surface where the surface of the side of the protective structure facing away from the base substrate is located, and θ is a half-power angle of the light emitting unit.

2. The light emitting substrate according to claim 1, wherein orthographic projections of the plurality of light emitting units on the base substrate fall within the orthographic projections of the plurality of reflective patterns on the base substrate respectively.

3. The light emitting substrate according to claim 1, wherein a distance between a center of an orthographic projection of the protective structure on the base substrate and a center of an orthographic projection of the light emitting unit on the base substrate is less than a first preset value; and a distances between a center of an orthographic projection of the reflective pattern on the base substrate and the center of the orthographic projection of the light emitting unit on the base substrate is less than a second preset value;

wherein the first preset value is a maximum value of the distance between the center of the orthographic projection of the protective structure on the base substrate and the center of the orthographic projection of the light emitting unit on the base substrate; the second preset value is a maximum value of the distance between the center of the orthographic projection of the reflective pattern on the base substrate and the center of the orthographic projection of the light emitting unit on the base substrate.

4. The light emitting substrate according to claim 1, wherein a quantity of the plurality of light emitting units is the same as a quantity of the plurality of protective structures, and a quantity of the plurality of protective structures is the same as a quantity of the plurality of reflective patterns.

5. The light emitting substrate according to claim 1, wherein shapes of the orthographic projections of the plurality of reflective patterns on the base substrate are one type of shapes as follows: polygons, circles, ellipses and rings.

6. The light emitting substrate according to claim 1, wherein material of the reflective pattern has reflectivity greater than 90%.

7. The light emitting substrate according to claim 1, wherein a thickness of the reflective pattern is greater than or equal to 20 microns and less than or equal to 30 microns.

8. The light emitting substrate according to claim 1, wherein a light emitting area of the light emitting unit is not greater than 50000 square microns.

9. A display apparatus, wherein the display apparatus comprises:
the light emitting substrate of claim 1; and
a display panel located at a light emitting side of the light emitting substrate.

10. A method for manufacturing a light emitting substrate, wherein the method comprises:
arranging a plurality of light emitting units at a side of a base substrate;
forming a plurality of protective structures at a side of the plurality of light emitting units facing away from the base substrate, wherein the plurality of protective structures each covers a respective one of the plurality of light emitting units; and forming reflective patterns at a side of the plurality of protective structures facing away from the plurality of light emitting units, wherein orthographic projections of the plurality of reflective patterns on the base substrate fall within orthographic projections of the plurality of protective structures on the base substrate;

wherein surfaces of sides of the plurality of protective structures facing away from the base substrate are first curved surfaces;

the plurality of reflective patterns are in direct contact with the surfaces of the plurality of protective structures;

surfaces of sides of the plurality of reflective patterns facing away from the plurality of protective structures are second curved surfaces; and a shape of the second curved surface is the same as a shape of a partial region of the first curved surface;

wherein shapes of the orthographic projections of the plurality of protective structures on the base substrate are circles; and a contact surface between the reflective pattern and a corresponding protective structure intersects a plurality of planes perpendicular to the base substrate to form a plurality of arcs, and an arc length l of an arc having a maximum length in the plurality of arcs satisfies:

$$l = \frac{\pi(4h^2 + D^2)\arccos\left[\frac{(R-h)\tan^2\theta + \sqrt{(R-h)^2 - h(h-2R)(1+\tan^2\theta)}}{R(1+\tan^2\theta)}\right]}{1440h},$$

wherein h is a maximum size of the protective structure in a direction perpendicular to the base substrate, D is a diameter of the orthographic projection of the protective structure on the base substrate, R is a radius of a spherical surface where the surface of the side of the protective structure facing away from the base substrate is located, and θ is a half-power angle of the light emitting unit.

11. The method according to claim 10, wherein the forming a plurality of reflective patterns at a side of the plurality of protective structures facing away from the light emitting units comprises:
forming the plurality of reflective patterns at the side of the plurality of protective structures facing away from the plurality of light emitting units through a glue spraying process or a printing process.

12. The method according to claim 10, wherein the forming plurality of reflective patterns at a side of the plurality of protective structures facing away from the plurality of light emitting units comprises:
forming a reflective layer at the side of the plurality of protective structures facing away from the plurality of light emitting units; and
performing an exposure process and a development process on the reflective layer to form a plurality of reflective patterns.

13. The method according to claim 10, wherein the forming a plurality of protective structures at a side of the plurality of light emitting units facing away from the base substrate comprises:
forming patterns of the plurality of protective structures at the side of the plurality of light emitting units facing away from the base substrate through a glue dispensing process or a jetting process.

* * * * *